United States Patent [19]

Makishima et al.

[11] Patent Number: 4,639,329

[45] Date of Patent: Jan. 27, 1987

[54] FUNCTIONAL ORGANIC-INORGANIC COMPOSITE AMORPHOUS MATERIAL AND PROCESS FOR ITS PRODUCTION

[75] Inventors: Akio Makishima, Sakuramura; Toshiro Tani, Ibaraki, both of Japan

[73] Assignees: National Institute for Researches in Inorganic Materials, Ibaraki; Agency of Industrial Science and Technology, Tokyo, both of Japan

[21] Appl. No.: 777,492

[22] Filed: Sep. 19, 1985

[30] Foreign Application Priority Data

Sep. 19, 1984 [JP] Japan ................................ 59-196360

[51] Int. Cl.$^4$ ............................................ H01C 13/00
[52] U.S. Cl. .................................. 252/501.1; 252/518; 136/258; 136/261; 136/263
[58] Field of Search ............... 252/501.1, 518; 430/95, 430/56, 83, 84; 136/258, 261, 263; 350/336, 386

[56] References Cited

U.S. PATENT DOCUMENTS

| | | | |
|---|---|---|---|
| 4,451,546 | 5/1984 | Kawamura et al. | 252/501.1 |
| 4,471,042 | 9/1984 | Komatsu et al. | 252/501.1 |
| 4,490,454 | 12/1984 | Misumi et al. | 252/501.1 |
| 4,499,331 | 2/1985 | Hamakawa et al. | 252/501.1 |

*Primary Examiner*—Josephine L. Barr
*Attorney, Agent, or Firm*—Oblon, Fisher, Spivak, McClelland & Maier

[57] ABSTRACT

A functional organic-inorganic composite amorphous material obtained by adding to an organic metal compound of silicon or germanium capable of being made amorphous by hydrolysis and dehydrating condensation, functional organic molecules soluble in a solvent capable of dissolving said organic metal compound, together with the solvent, followed by hydrolysis and dehydrating condensation to form an integrated composite.

5 Claims, No Drawings

FUNCTIONAL ORGANIC-INORGANIC COMPOSITE AMORPHOUS MATERIAL AND PROCESS FOR ITS PRODUCTION

BACKGROUND OF THE INVENTION

1. Field of the Invention

The present invention relates to a functional organic-inorganic composite amorphous material useful in the fields of optoelectronics, biotechnology and energy, and a process for its production.

2. Description of the Prior Art

As materials wherein various functions are imparted to organic molecules, there have been known organic colorant lasers, organic photoconductors, organic solar cells, organic electroluminescence, organic electrochromic displays, organic solar concentrators, various sensors, non-linear optical elements, optical recording media wherein hole burning effects are utilized, and optical discs.

However, for instance, in the organic colorant lasers, the organic colorant molecules are used in the form of a solution obtained by dissolving the organic colorant molecules in a solvent such as water or ethanol, or as dissolved or dispersed in an organic polymer.

When used in the form of a liquid, not only the handling was inconvenient, but also there was a difficulty such as the deterioration due to dissolved oxygen. Whereas, when an organic polymer is used as the base material, there was a fundamental difficulty in the rigidity.

On the other hand, in the case of organic photoconductors or organic solar cells, organic molecules having photoconductivity or photoelectromotive force are dispersed or dissolved in an organic polymer. However, they were likely to undergo deterioration due to dissolved oxygen in the organic polymer, and there was an additional problem that the properties of the organic molecules deteriorated due to the friction, since the organic polymer was flexible.

Thus, in spite of the merit that the functional organic molecules have various functions, their application as functional electronic materials was limited because a suitable rigid medium was not available.

On the other hand, an attempt to dissolve organic molecules in a rigid medium such as inorganic glass, was known to fail, since the temperature for the production of ordinary inorganic glass was as high as about 300° C. or higher, whereby functional organic molecules underwent thermal decomposition and lost their functions.

SUMMARY OF THE INVENTION

It is an object of the present invention to provide a novel organic-inorganic composite amorphous material wherein functional organic molecules and inorganic amorphous substance are integrally formed into a composite in their molecular levels to impart the functions of the functional organic molecules to the inorganic amorphous substance, and to provide a process for its production.

During a research on the synthesis of new colored glass in the study of electronic functions of organic molecules, the present inventors have found it possible to obtain a colored inorganic amorphous substance by mixing organic molecules with an organic metal compound of silicon or germanium capable of being hydrolyzed and condensed by dehydration, together with a solvent, followed by hydrolysis and dehydrating condensation. On the basis of this discovery, it has been found that when an inorganic amorphous substance is produced in the same manner by using functional organic molecules as the organic molecules, it is readily possible to obtain a functional organic-inorganic composite amorphous material. The present invention has been accomplished on the basis of such discovery.

Namely, the present invention provides a functional organic-inorganic composite amorphous material obtained by adding to an organic metal compound of silicon or germanium capable of being made amorphous by hydrolysis and dehydrating condensation, functional organic molecules soluble in a solvent capable of dissolving said organic metal compound, together with the solvent, followed by hydrolysis and dehydrating condensation to form an integrated composite.

DETAILED DESCRIPTION OF THE INVENTION

In the present invention, the organic silicon compound or the organic germanium compound capable of being made amorphous by hydrolysis and dehydrating condensation may be, for instance, a silicic acid alkoxide such as methyl silicate or ethyl silicate, or a germanium alkoxide such as methyl germanate or ethyl germanate.

As the functional organic molecules, there may be mentioned xanthene-type molecules represented by Rhodamine 6G or Rhodamine B, a cumarin derivative such as 4-methyl-7-hydroxycumarin, a chain conjugated polyene represented by a bixin, acridine-type molecules such as acridine, a condensed polycyclic aromatic hydrocarbon such as pyrene, water-soluble porphyrin type molecules such as $\alpha, \beta, \gamma, \delta$-tetra (4-N-trimethylaminophenyl) porphyrin, naphthoquinone-type molecules such as naphthazarin or anthraquinone-type molecules such as quinizarin.

These functional organic molecules are added as dissolved in a solvent. As such a solvent, there may be employed a solvent which is capable of dissolving also the organic metal compound of silicon and germanium. Thus, a uniform mixture is obtainable.

The mixture thereby obtained is adjusted to have a pH of from 7 to 3. If the pH exceeds 7, it requires a long period of time for the hydrolysis and dehydrating condensation and synetesis takes place. On the other hand, if the pH is lower than 3, the functional organic molecules are likely to be decomposed in the acidic environment, and it tends to require a long period of time for the hydrolysis and dehydrating condensation. Within a pH range of from 7 to 3, the hydrolysis and dehydrating condensation reactions proceed smoothly, and the time required for the completion of the reaction is short. Further, solidification takes place uniformly in a single phase from the solution without bringing about a syneresis phenomenon. Thus, it is most preferred to use a pH within this range.

After adjusting the pH to a level of from 7 to 3, the mixture is heated to a temperature of about 60° C., and it undergoes hydrolysis, whereby a gel is obtained.

The gel thereby obtained is subjected to dehydrating condensation to obtain a solid. In this case, if water and the solvent are rapidly evaporated, cracks are likely to form. Therefore, it is important to conduct the evaporation at a constant rate within a range of from 0.0001 to 0.03 g/cm$^2$.day. If the evaporation rate is slower than 0.0001 g/cm$^2$.day, it takes a long time, and if the evaporation rate is faster than 0.03 g/cm$^2$.day, cracks are likely to form.

The solid thereby obtained comprises functional organic molecules uniformly dispersed and maintained in amorphous silicon or germanium containing hydroxyl groups. By molding the gel, the amorphous solid may be formed into any desired shape such as a thin layer, a thick layer, a plate, a film, a fiber, a rod or a powder.

Now, the present invention will be described in further detail with reference to Examples. However, it should be understood that the present invention is by no means restricted to these specific Examples.

EXAMPLE 1

Quinizarin solid powder was dissolved in an ethyl alcohol solution to obtain an alcohol solution of quinizarin having a concentration of $10^{-6}$mol/1 mol.

22.5 cc of this solution, 20.0 cc of ethyl silicate and 7.5 cc of water were mixed and stirred to obtain a uniform yellow solution. To this solution, 0.2 cc of concentrated hydrochloric acid was dropwise added to bring the pH to about 5. This solution was heated to 60° C. for hydrolysis, whereby a uniform gel was obtained.

This gel was aged in an atmosphere at 40° C. under relative humidity of 50% for three days and subjected to dehydrating condensation to obtain a yellow light transmitting solid. The incorporated quinizarin was solidified as uniformly dissolved in a slightly orange colored transparent solid, and no precipitate of quinizarin was observed. From the X-ray analysis, the solid was amorphous.

The solid obtained was a hard rigid body having a Vicker's hardness of about 220 kg/mm$^2$. Further, it is an amorphous substance of high silicic acid type, and has a thermal expansion coefficient as small as about $10 \times 10^{-7}1/°C.$, and thus it is durable against rapid heating and rapid cooling. For instance, even when cooled from room temperature to about 4° K., it does not undergo a deformation, and even when it was brought from the extremely low temperature of about 4° K. to room temperature, no cracks are likely to form. Thus, it is extremely stable.

Further, it was immersed in a hydrochloric acid solution having a pH of 3 at 40°°C. for 2 days, and then the weight change was measured, whereby no change in weight was observed. The same result was obtained when it was immersed in a warm water of 50° C.

The light absorption spectrum of this amorphous substance was measured in a visible light range, whereby an absorption band at 480 nm characteristic of quinizarin was observed. When compared with the spectrum as measured in an alcohol solution, this absorption band showed no change in the position, and with respect to the shape of the absorption band, a few fine structures attributable to oscillation ranks are observed as expanded. From the spectrum and the degree of the absorbance, the incorporated quinizarin molecules are present as dispersed in a molecular level in the amorphous substance without decomposition.

EXAMPLE 2

A colorless transparent amorphous solid of high silicic acid type containing pyrene was prepared in the same manner as in Example 1 by using an ethyl alcohol solution containing $10^{-5}$mol/1 mol of pyrene ($C_{16}H_{10}$) as photoconductive organic molecules.

EXAMPLE 3

A slightly red transparent amorphous solid of high silicic acid type was prepared in the same manner as in Example 1 by using an ethyl alcohol solution containing $10^{-5}$mol/1 mol of 5,8-dihydroxy-1,4-naphthoquinone as luminescent organic molecules.

EXAMPLE 4

A strong organge yellow colored transparent amorphous solid of high silicic acid type was prepared in the same manner as in Example 1 by using an ethyl alcohol solution containing $10^{-5}$mol/1 mol of Rhodamine 6G perchlorate as laser emitting organic molecules.

EXAMPLE 5

A strong pink colored transparent amorphous solid of a high silicic acid type was prepared in the same manner as in Example 1 by using an ethyl alcohol solution containing $10^{-5}$mol/1 mol of Rhodamine B as laser emitting organic molecules.

EXAMPLE 6

A colorless transparent amorphous solid of a high silicic acid type was prepared in the same manner as in Example 1 by using an ethyl alcohol solution containing $10^{-5}$mol/1 mol of cumarin as laser emitting organic molecules.

EXAMPLE 7

A slightly yellow transparent amorphous solid of a high silicic acid type was prepared in the same manner as in Example 1 by using an ethyl alcohol solution containing $10^{-5}$mol/1 mol of Acridine-Red as laser emitting organic molecules.

EXAMPLE 8

A strong yellow transparent amorphous solid of high silicic acid type was prepared in the same manner as in Example 1 by using an ethyl alcohol solution containing $10^{-5}$mol/1 mol of fluorescein ($C_{20}H_{12}O_5$) as laser emitting organic molecules. The entire operation of this Example was conducted in a dark room.

EXAMPLE 9

A strong yellowish orange colored solid of high silicic acid type was obtained in the same manner as in Example 1 by using an ethyl alcohol solution containing $10^{-3}$mol/1 mol of quinizarin as organic molecules showing hole burning effects. In this solid, precipitation of fine particles of quinizarin was observed throughout the solid body.

EXAMPLE 10

A slightly yellow transparent amorphous solid of TiO$_2$—SiO$_2$ type was prepared in the same manner as in Example 1 by using a homogeneous mixture of 0.5 cc of the ethyl alcohol solution containing $10^{-5}$mol/1 mol of quinizarin of Example 9, 10 cc of ethyl silicate and 4 cc of titanium isopropoxide. The TiO$_2$—SiO$_2$ type glass is known to have no thermal expansion property.

EXAMPLE 11

5.7 cc of an ethyl alcohol solution containing $10^{-6}$mol/1 mol of laser oscillating Rhodamine 6G, 5 cc of ethyl silicate and 1.9 cc of water were mixed and stirred to obtain a uniform solution. This neutral solution was left to stand still at room temperature for 10 days, and a red transparent amorphous solid of high silicic acid type was obtained. Such a long period of time was required.

EXAMPLE 12

A solution of a mixture comprising 5.7 cc of an ethyl alcohol solution containing $10^{-6}$ mol/1 mol of Rhodamine 6G as laser oscillating organic molecules, 7.4 cc of ethyl germanate solution and 1.5 cc of water, was prepared, and adjusted to a pH of 4 with hydrochloric acid. This solution was heated to 60° C., hydrolyzed for 2 hours, and then aged for 3 days in an atmosphere at 40° C. under a relative humidity of 50%, whereby a red uniform transparent solid was obtained.

Thus, the present invention provides a novel inorganic amorphous material integrally combined with functional organic molecules. The material is very easy to handle, and has high mechanical strength and excellent functionality, whereby the functional organic molecules hardly deteriorate.

What is claimed is:

1. A process for producing a functional organic-inorganic composite amorphous material, which comprises adding to an organic metal compound of silicon or germanium capable of being made amorphous by hydrolysis and dehydrating condensation, functional organic molecules soluble in a solvent capable of dissolving said organic metal compound, said functional organic molecules being selected from the group consisting of xanthene, coumarin, conjugated polyene, acridine, condensed polycyclic aromatic hydrocarbon, porphyrin, naphthoquinone and anthraquinone molecules, together with said solvent, adjusting the pH to a level of from 7 to 3, and then subjecting the mixture to hydrolysis followed by dehydrating condensation to form an integrated composite.

2. The process for producing a functional organic-inorganic composite amorphous material of claim 1, which further comprises evaporating the solvent and water from the integrated composite thereby obtained, at an evaporation rate of from 0.0001 to 0.03 $g/cm^2$.day.

3. A functional organic-inorganic composite amorphous material obtained by the process of claim 1.

4. A functional organic-inorganic composite amorphous material obtained by the process of claim 2.

5. The functional organic-inorganic composite amorphous material according to claim 3 or 4, wherein said functional organic molecules have a function for laser emission, photoconductivity, photoelectromotive force, electroluminescence, electrochromic properties. nonlinear optical properties, hole burning effects or optical recording properties.

* * * * *